United States Patent
Jung et al.

(10) Patent No.: US 11,101,454 B2
(45) Date of Patent: Aug. 24, 2021

(54) METHOD OF PEELING MOTHER PROTECTIVE FILM, METHOD OF MANUFACTURING ORGANIC LIGHT-EMITTING DISPLAY APPARATUS, AND ORGANIC LIGHT EMITTING DISPLAY APPARATUS MANUFACTURED USING THE SAME

(71) Applicant: Samsung Display Co., Ltd., Yongin-si (KR)

(72) Inventors: Jiwon Jung, Yongin-si (KR); Youngji Kim, Yongin-si (KR); Yiseul Um, Yongin-si (KR); Younghoon Lee, Yongin-si (KR); Youngseo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/589,187

(22) Filed: Oct. 1, 2019

(65) Prior Publication Data

US 2020/0168849 A1 May 28, 2020

(30) Foreign Application Priority Data

Nov. 22, 2018 (KR) .................... 10-2018-0145652

(51) Int. Cl.
*H01L 51/56* (2006.01)
*H01L 27/32* (2006.01)
*H01L 51/52* (2006.01)

(52) U.S. Cl.
CPC .......... *H01L 51/56* (2013.01); *H01L 27/3244* (2013.01); *H01L 51/5246* (2013.01); *H01L 2251/566* (2013.01)

(58) Field of Classification Search
CPC .............. H01L 51/56; H01L 51/5253; H01L 2251/566; H01L 51/5246
See application file for complete search history.

(56) References Cited

U.S. PATENT DOCUMENTS 9,755,192 B2  9/2017  You et al.
10,081,173 B2 9/2018  Choi et al.
(Continued)

FOREIGN PATENT DOCUMENTS

DE  10 2016 108195    11/2017
KR  10-2015-0036939    4/2015
(Continued)

OTHER PUBLICATIONS

Extended European Search Report dated Apr. 15, 2020, issued to European Patent Application No. 19210912.2.

*Primary Examiner* — Feifei Yeung Lopez
(74) *Attorney, Agent, or Firm* — H.C. Park & Associates, PLC

(57) ABSTRACT

A method of peeling a mother protective film from a mother display panel includes: laminating the mother display panel and the mother protective film, the mother display panel including a plurality of display cells each including a display area and a peripheral area around the plurality of display cell; forming a target area and a dummy area in the mother protective film by forming a cutting line in a closed loop shape enclosing the target area corresponding to each of the display cells and a first additional cutting line in a first direction near the cutting line; physically peeling off the dummy area from the mother display panel, including: primarily peeling off a portion of the mother protective film adjacent to the first additional cutting line; and secondarily peeling off rest of the mother protective film from the mother display panel along the cutting line.

18 Claims, 18 Drawing Sheets

(56) References Cited

U.S. PATENT DOCUMENTS

| | | | |
|---|---|---|---|
| 10,177,327 | B2 | 1/2019 | Jung et al. |
| 2002/0134485 | A1 | 9/2002 | Habeck et al. |
| 2004/0038439 | A1* | 2/2004 | Sakamoto ............... H01L 51/56 |
| | | | 438/46 |
| 2009/0128030 | A1 | 5/2009 | Kai et al. |
| 2014/0118970 | A1* | 5/2014 | Kim ................... H04M 1/0268 |
| | | | 361/750 |
| 2014/0127480 | A1* | 5/2014 | Masuda ................... G02B 5/20 |
| | | | 428/201 |
| 2015/0053952 | A1 | 2/2015 | Okumura et al. |
| 2017/0084879 | A1 | 3/2017 | Wen et al. |
| 2017/0084883 | A1 | 3/2017 | Kwon et al. |
| 2017/0183251 | A1 | 6/2017 | Forenz et al. |
| 2017/0194579 | A1 | 7/2017 | Wang |
| 2018/0012787 | A1 | 1/2018 | Oka et al. |
| 2018/0040837 | A1 | 2/2018 | Seo et al. |
| 2018/0108876 | A1 | 4/2018 | Yeo et al. |
| 2018/0175115 | A1* | 6/2018 | Choi ..................... H01L 27/322 |
| 2018/0178493 | A1* | 6/2018 | Fujioka ................. B32B 27/308 |

FOREIGN PATENT DOCUMENTS

| | | |
|---|---|---|
| KR | 10-2017-0137268 | 12/2017 |
| KR | 10-2018-0016681 | 2/2018 |
| KR | 10-2018-0023722 | 3/2018 |
| KR | 10-2018-0029739 | 3/2018 |

\* cited by examiner

<PRIOR ART>

<PRIOR ART>

<PRIOR ART>

<PRIOR ART>

<PRIOR ART>

<PRIOR ART>

<PRIOR ART>

METHOD OF PEELING MOTHER PROTECTIVE FILM, METHOD OF MANUFACTURING ORGANIC LIGHT-EMITTING DISPLAY APPARATUS, AND ORGANIC LIGHT EMITTING DISPLAY APPARATUS MANUFACTURED USING THE SAME

CROSS-REFERENCE TO RELATED APPLICATION

This application claims priority from and the benefit of Korean Patent Application No. 10-2018-0145652, filed on Nov. 22, 2018, which is hereby incorporated by reference for all purposes as if fully set forth herein.

BACKGROUND

Field

Exemplary embodiments of the invention relate generally to a method of peeling a mother protective film, a method of manufacturing an organic light-emitting display apparatus, and an organic light-emitting display apparatus manufactured using the same, whereby process efficiency may be increased and costs may be reduced.

Discussion of the Background

An organic light-emitting display apparatus includes a substrate, an organic light-emitting device on the substrate, and an encapsulation member encapsulating the organic light-emitting device. Unlike the case when an encapsulation member formed of glass is used, when an encapsulation member having a thin-film structure including an organic layer and an inorganic layer is used, a protective film may be arranged temporarily or permanently on the encapsulation member to protect the thin-film encapsulation member and the organic light-emitting device from external impurities.

The organic light-emitting display apparatus is manufactured by simultaneously manufacturing a plurality of display cells on a mother substrate, separating the plurality of display cells from each other via scribing, and performing a subsequent process such as a module attaching operation on each of the display cells. The scribing process is performed by forming a cutting line in a peripheral area outside a display area of the display cells on a mother substrate. When a glass lower substrate and a glass upper substrate are combined with each other, scribing may be performed using a wheel. When a flexible lower substrate and a thin-film encapsulation member are combined with each other, scribing may be performed using a laser. However, when a protective film is attached on a combination of a glass lower substrate and a thin-film encapsulation member, it is difficult to perform a scribing operation.

The above information disclosed in this Background section is only for understanding of the background of the inventive concepts, and, therefore, it may contain information that does not constitute prior art.

SUMMARY

Methods according to exemplary implementations of the invention include a method of peeling a mother protective film, a method of manufacturing an organic light-emitting display apparatus using the same, having increased process efficiency and reduced costs. Devices constructed according to exemplary implementations of the invention include the organic light-emitting display apparatus manufactured using the same.

Additional features of the inventive concepts will be set forth in the description which follows, and in part will be apparent from the description, or may be learned by practice of the inventive concepts.

According to one or more embodiments of the invention, a method of peeling a mother protective film from a mother display panel includes: laminating the mother display panel and the mother protective film, the mother display panel including a plurality of display cells each including a display area and a peripheral area around the plurality of display cell; forming a target area and a dummy area in the mother protective film by forming a cutting line in a closed loop shape enclosing the target area corresponding to each of the display cells and a first additional cutting line in a first direction near the cutting line; physically peeling off the dummy area from the mother display panel, including: primarily peeling off a portion of the mother protective film adjacent to the first additional cutting line; and secondarily peeling off rest of the mother protective film from the mother display panel along the cutting line.

Depths of the cutting line and the first additional cutting line may be less than a thickness of the mother protective film.

The cutting line and the first additional cutting line may be formed using a laser beam.

The laser beam may include a $CO_2$ laser.

The cutting line and the first additional cutting line may be formed using a knife.

The cutting line and the first additional cutting line may be formed using an ultrasound cutter including a vibrator and a blade.

The first additional cutting line may be connected to the cutting line.

At least an end of the first additional cutting line may be formed within the cutting line.

The first additional cutting line may be spaced apart from the cutting line.

The method may further include forming, in the mother protective film, a second additional cutting line connected to the first additional cutting line.

The primarily peeling off of the portion of the mother protective film may include applying a first force between the first additional cutting line and the second additional cutting line.

The primarily peeling off of the portion of the mother protective film may include applying a first force having a component in a second direction away from the first additional cutting line, and the secondarily peeling off of the rest of the mother protective film may include applying a second force in the first direction to the primarily peeled mother protective film.

The primarily peeled mother protective film may include a portion of the cutting line extending in a direction intersecting with the second force.

The first force may be applied using a peeling pin.

The target area defined by the cutting line in a closed loop shape may have a smaller area than the display cell.

The mother protective film may include an adhesive layer attached to the mother display panel and a base substrate arranged on the adhesive layer.

The method may further include, before the primarily peeling, irradiating the dummy area with ultraviolet rays (UV) to reduce an adhesive force of a portion of the adhesive layer corresponding to the dummy area.

The method may further include, after the secondarily peeling, irradiating the target area with ultraviolet rays (UV) to increase an adhesive force of a portion of the adhesive layer corresponding to the target area.

The mother display panel may include a substrate including a glass material, and the method may further include, before the primarily peeling off of the mother display panel, etching the substrate to reduce a thickness of the substrate.

According to one or more embodiments of the invention, a method of manufacturing an organic light-emitting display apparatus includes forming a mother display panel on a mother substrate, the mother display panel including: display cells including: a plurality of organic light-emitting devices; and an encapsulation member encapsulating the plurality of organic light-emitting devices; and a peripheral area arranged around the display cells; laminating a mother protective film on the mother display panel; forming a target area and a dummy area on the mother protective film by forming a cutting line in a closed loop shape enclosing the target area corresponding to each of the display cells and an additional cutting line in a first direction near the cutting line; physically peeling off the dummy area from the mother display panel, including: primarily peeling off a portion of the mother protective film adjacent to the additional cutting line; and secondarily peeling off rest of the mother protective film from the mother display panel along the cutting line; dividing the mother substrate into a plurality of display cells by scribing the mother substrate; and processing rims of the plurality of display cells.

The mother substrate may be scribed using a wheel cutting device.

The mother substrate may be scribed by applying a force to the wheel cutting device in a direction from the mother protective film to the mother substrate.

The processing of the rims of the plurality of display cells may include rounding corner portions of the plurality of display cells.

The processing of the rims of the plurality of display cells may include polishing the rims of the plurality of display cells.

The encapsulation member may include at least one organic layer and at least one inorganic layer.

The method may further include, before laminating the mother protective film, forming a touch layer on the encapsulation member.

The mother protective film may include a polarization film.

According to one or more embodiments of the invention, an organic light-emitting display apparatus includes a substrate including glass; a display area arranged on the substrate and including an organic light-emitting device; a non-display area arranged on the substrate and located around the display area; a thin-film encapsulation member including an organic layer and an inorganic layer and configured to cover the display area; and an adhesive layer having an irregular width and an irregular height at a portion of a virtual closed loop-shaped line that surrounds the display area.

According to one or more embodiments of the invention, a method of manufacturing an organic light-emitting display apparatus includes forming, on a substrate, a display area including a plurality of organic light-emitting devices, a non-display area located within the display area, and a thin-film encapsulation member encapsulating the display area, the thin-film encapsulation member including an organic layer and an inorganic layer; laminating a protective film on the thin-film encapsulation member, the protective film including an adhesive layer and a base film; forming a cutting line in the protective film in a closed loop shape in the non-display area, the cutting line having a depth that is less than or equal to a thickness of the protective film; and peeling the protective film from the substrate by applying a twisting force along the cutting line in the closed loop shape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
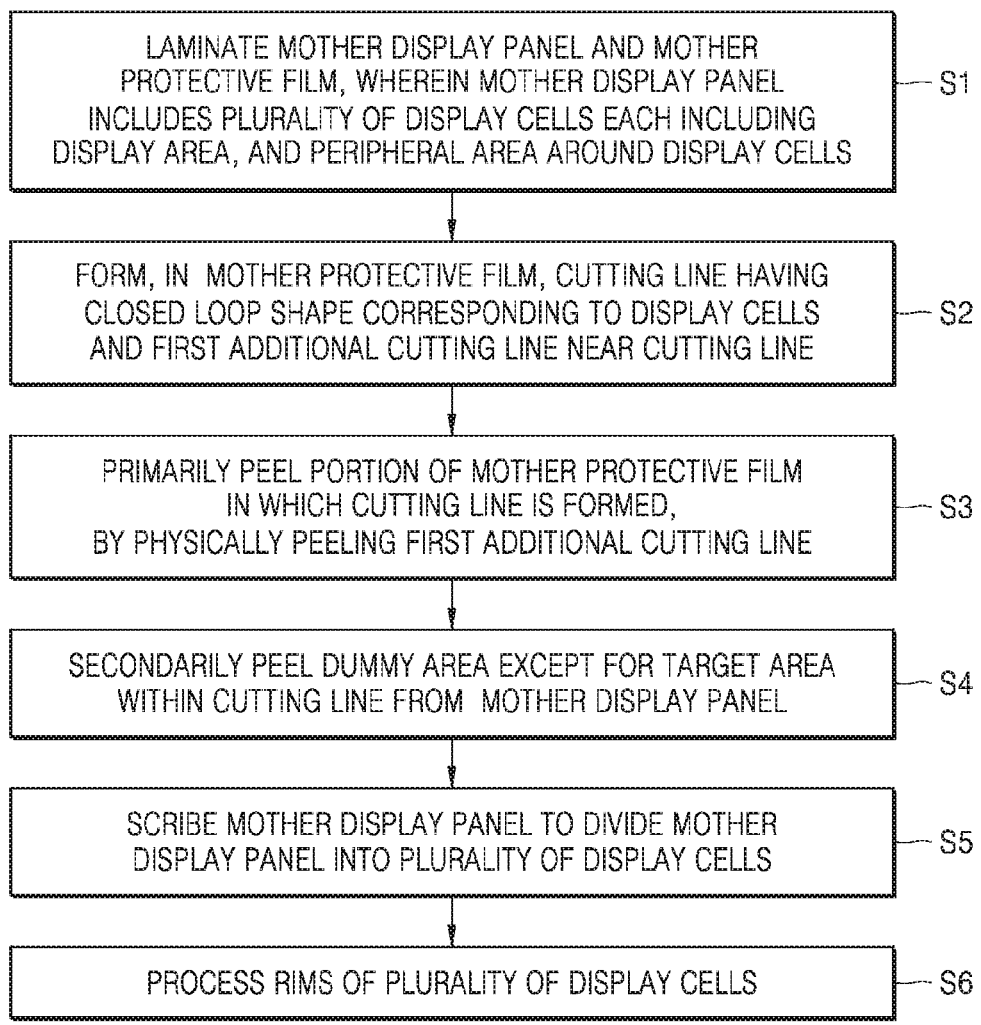
FIG. 1 is a flowchart of a method of manufacturing an organic light-emitting display apparatus, according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, an X-axis, a Y-axis, and a Z-axis are not limited to three axes of a rectangular coordinate system, such as the x, y, and z-axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a flowchart of a method of manufacturing an organic light-emitting display apparatus, according to an exemplary embodiment.

Figure 2A:
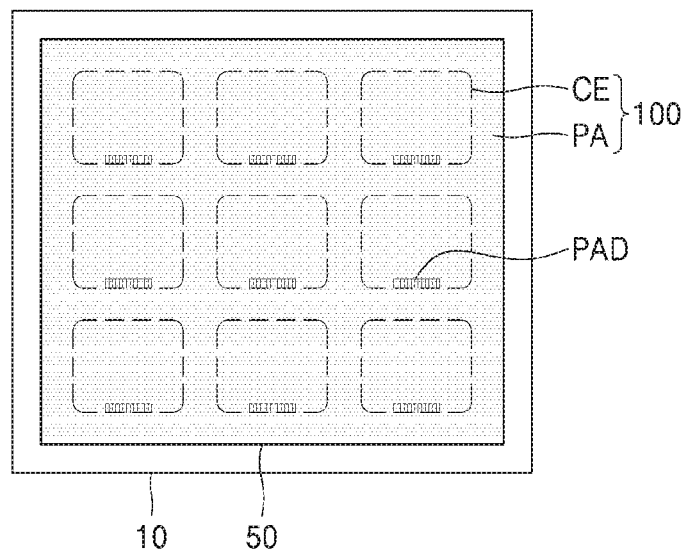
FIGS. 2A, 2B, 2C, 2D, 2E, 2F, and 2G are plan views schematically illustrating a method of manufacturing an organic light-emitting display apparatus according to the exemplary embodiment of FIG. 1.
Figure 2B:
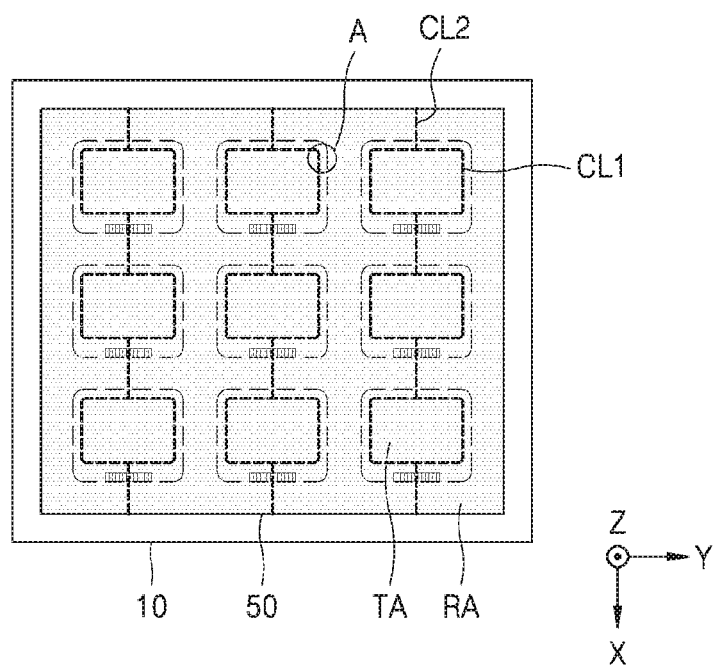
Figure 2C:
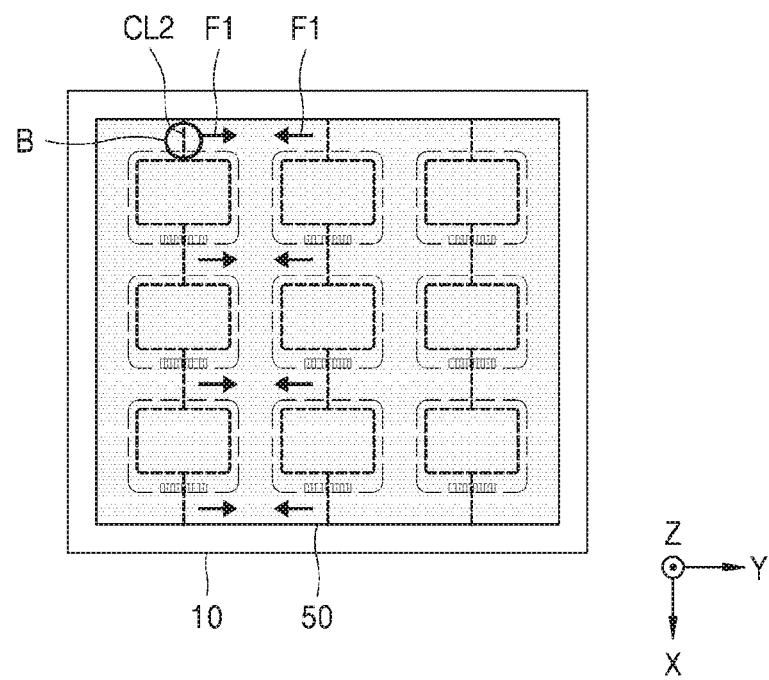
Figure 2D:
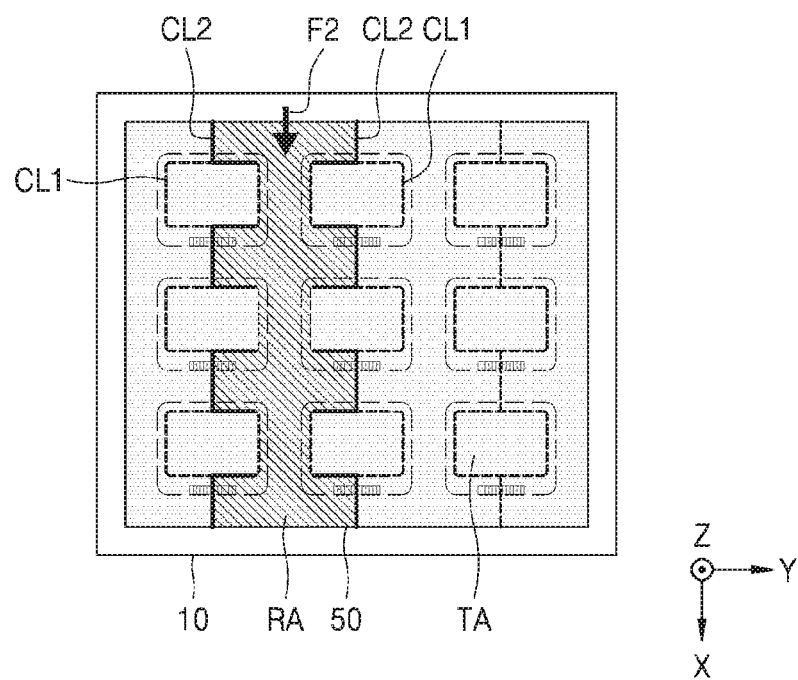
Figure 2E:
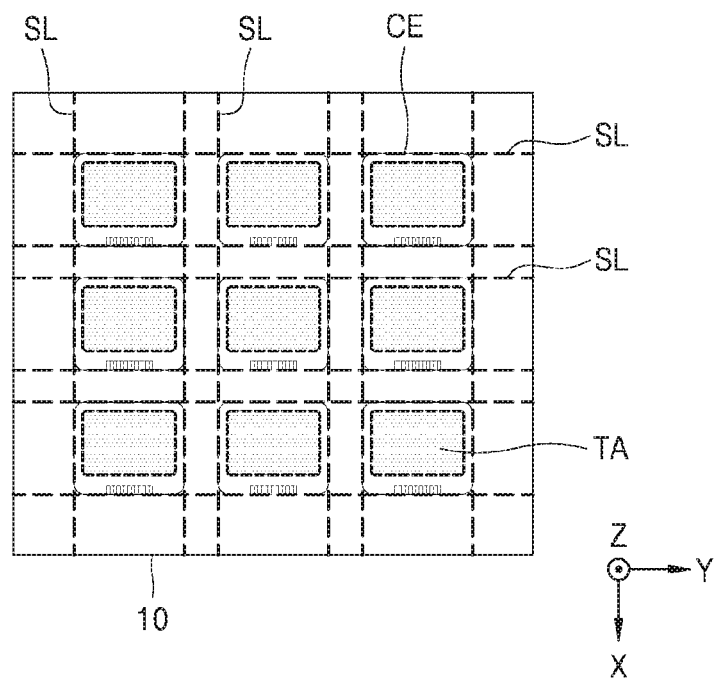
Figure 2F:
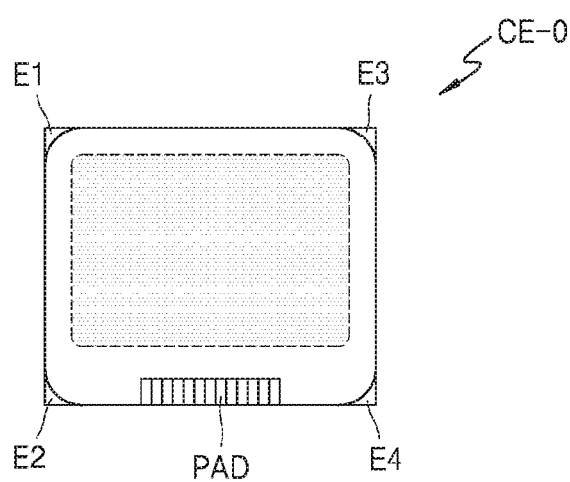
Figure 2G:
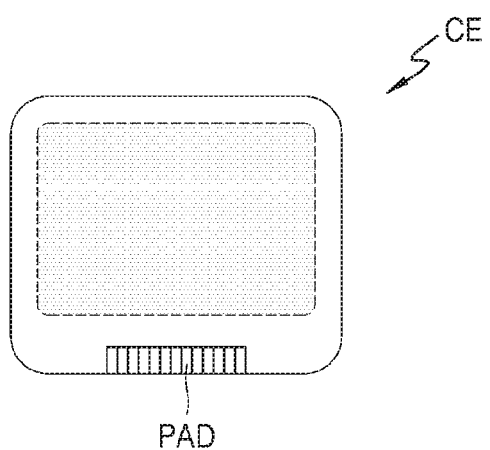

FIGS. 2A, 2B, 2C, 2D, 2E, 2F, and 2G are plan views schematically illustrating a method of manufacturing an organic light-emitting display apparatus according to the exemplary embodiment of FIG. 1. In detail, FIG. 2A is a plan view illustrating a mother display panel 100 and a mother protective film 50 that are laminated to each other; FIG. 2B is a plan view illustrating the mother protective film 50 including cutting lines CL1 and first additional cutting lines CL2 formed therein; FIG. 2C is a plan view illustrating primary peeling of the mother protective film 50; FIG. 2D is a plan view illustrating secondary peeling of the mother protective film 50; FIG. 2E is a plan view illustrating an operation of scribing a mother substrate; FIG. 2F is a plan view illustrating an operation of rounding corner portions of a display cell CE; and FIG. 2G is a plan view illustrating an operation of polishing a rim of the display cell CE.

Figure 3:
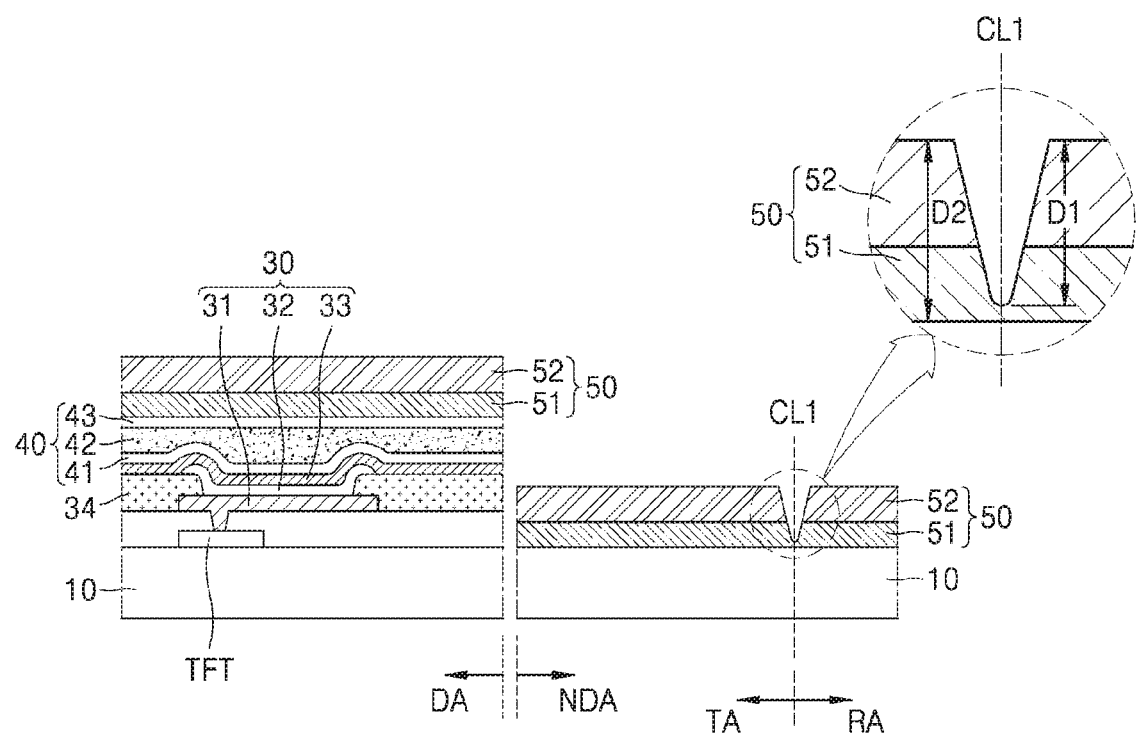
FIG. 3 is a schematic cross-sectional view of an area A of FIG. 2B.
Figure 4:
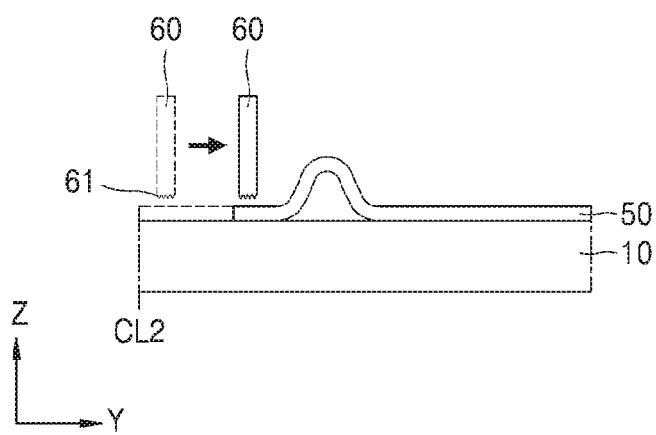
FIG. 4 is a schematic cross-sectional view of an area B of FIG. 2C.

FIG. 3 is a schematic cross-sectional view of an area A of FIG. 2B, and FIG. 4 is a schematic cross-sectional view of an area B of FIG. 2C.

Referring to FIG. 1, the method of manufacturing an organic light-emitting display apparatus according to the exemplary embodiment of FIG. 1 may include operation S1 of laminating a mother display panel and a mother protective film, the mother display panel including a plurality of display cells each including a display area, and a peripheral area around the display cells, operation S2 of forming, in the mother protective film, a cutting line having a closed loop shape corresponding to the display cells and a first additional cutting line near the cutting line, operation S3 of primarily peeling a portion of the mother protective film in which the cutting line is formed, by applying a first force to the first additional cutting line, operation S4 of secondarily peeling a dummy area except a target area within the cutting line from the mother display panel by applying a second force to the mother protective film, operation S5 of scribing the mother display panel to divide the mother display panel into the plurality of display cells, and operation S6 of processing rims of the plurality of display cells. Operations S1, S2, S3, and S4 constitute a method of separating the mother protective film. The mother protective film 50 refers to a protective film in a mother state.

Referring to FIG. 2A, the mother protective film 50 is laminated on the mother display panel 100.

The mother display panel 100 includes a plurality of display cells CE and a peripheral area PA located around the display cells CE.

Each display cell CE is a minimum unit that may be individually separated after a scribing process and distributed as a display apparatus, and may include a display area DA (see FIG. 3) and a non-display area NDA (see FIG. 3) including a pad unit PAD.

The display area DA is an area displaying an image, and a plurality of pixels each including an organic light-emitting device 30 (see FIG. 3) may be arranged in the display area DA. Each pixel may include at least two thin-film transistors and at least one capacitor.

The non-display area NDA is an area where no images are displayed, and wiring, a pad unit PAD, and a circuit unit that is used to apply an electrical signal to the display area DA may be arranged in the non-display area NDA. Although nine display cells CE are illustrated in FIG. 2A, this is an example. In actual, the mother display panel 100 may include more display cells CE.

The peripheral area PA is an area that is removed after a scribing operation. A wiring or a pad used to inspect performance of display cells CE may be arranged in a portion of the peripheral area PA, and, in another portion of the peripheral area PA, no functional layers may be formed, and only the mother substrate 10 may be arranged or some insulating layers may be further arranged on the mother substrate 10.

The mother substrate 10 may include a glass material. The mother substrate 10 formed of a glass material is more rigid than a substrate formed of a plastic material, and thus, display cells CE may be formed on the mother substrate 10 formed of a glass material, without a supporting substrate, thus simplifying a process of attaching and detaching a supporting substrate.

The mother protective film 50 is attached on the display cells CE to protect the display cells CE. The mother protective film 50 may include an adhesive layer 51 (see FIG. 3) and a base film 52 (see FIG. 3).

The base film 52 is a plastic film supporting the adhesive layer 51, and may include, for example, polyethylene terephthalate (PET).

The adhesive layer 51 includes an adhesive material. A dummy area RA (see FIG. 2B) of the mother protective film 50 except target areas TA (see FIG. 2B) may be removed before a scribing operation, and the target areas TA may be removed after the display cells CE are completed.

Referring to FIG. 2B, cutting lines CL1 and first additional cutting lines CL2 are formed on the mother protective film 50.

Each cutting line CL1 has a closed loop shape that is smaller than an area of the display cell CE, in an area corresponding to the display cell CE, and each first additional cutting line CL2 extends in a first direction X and connected between adjacent cutting lines CL1, and each end of the first additional cutting line CL2 extends to each end of the mother protective film 50.

The mother protective film 50 includes the target areas TA defined by the cutting lines CL1 each having a closed loop shape, and the dummy area RA outside the target areas TA.

Referring to FIG. 3 illustrating a portion A of FIG. 2B, a target area TA on the inside of a cutting line CL1 may include the display area DA and a portion of the non-display area NDA.

A thin-film transistor TFT and a capacitor and various wires may be arranged on the mother substrate 10 in the display area DA. The organic light-emitting device 30 that is electrically connected to at least one thin-film transistor TFT may be arranged on the mother substrate 10.

The organic light-emitting device 30 may include a first electrode 31, an intermediate layer 32 including an organic emissive layer, and a second electrode 33.

The first electrode 31 and the second electrode 33 may include a reflective layer formed of Mg, Al, Pt, Pd, Au, Ni, Nd, Ir, Cr or a compound thereof, or a transparent conductive oxide layer on or under the reflective layer. Alternatively, the first electrode 31 and the second electrode 33 may be a thin film including Ag or an Ag alloy or may include a transparent conductive oxide layer formed on a thin film. The first electrode 31 and the second electrode 33 may be formed as a reflective electrode or a light-transmissive electrode according to a type and thickness of a conductive material.

A pixel defining layer 34 covering an end of the first electrode 31 may prevent or suppress an electric field concentration at the end of the first electrode 31 and defines a light-emitting area.

The intermediate layer 32 may further include, in addition to the organic emissive layer, at least one of a hole injection layer, a hole transport layer, an electron transport layer, and an electron injection layer.

A thin-film encapsulation member 40 is arranged on the organic light-emitting device 30. The thin-film encapsulation member 40 may include a first inorganic layer 41, an organic layer 42, and a second inorganic layer 43. The organic layer 42 may include a polymer-based material such as polymethyl methacrylate (PMMA), polycarbonate (PC), polystyrene (PS), acryl-based resin, epoxy-based resin, polyimide, and polyethylene. The first inorganic layer 41 and the second inorganic layer 43 may include aluminum nitride (AlN), aluminum oxide ($Al_2O_3$), titanium nitride (TiN), titanium oxide ($TiO_2$), silicon oxynitride (SiON), silicon nitride (SiNx), silicon oxide (SiOx), or the like.

The mother protective film 50 including the adhesive layer 51 and the base film 52 on the thin-film encapsulation member 40 is arranged in the display area DA. The mother protective film 50 is integrally attached, that is, as a single unit, over an area covering the non-display area NDA and up to the dummy area RA which is outside the target area TA.

Although the mother protective film 50 attached on the thin-film encapsulation member 40 is illustrated in FIG. 3, a touch sensing layer may be further arranged on the thin-film encapsulation member 40, and the mother protective film 50 may be attached onto the touch sensing layer.

According to another exemplary embodiment, instead of a structure where the thin-film encapsulation member 40 and a touch sensing layer are independent of each other, a touch sensing layer may be formed between thin films of the thin-film encapsulation member 40, and the mother protective film 50 may be attached to an outermost thin film of the thin-film encapsulation member 40.

According to another exemplary embodiment, a polarization film may be further included on the thin-film encapsulation member 40, and the mother protective film 50 may be attached onto the polarization film.

According to another exemplary embodiment, the mother protective film 50 may be attached onto the thin-film encapsulation member 40 on which both a touch sensing layer and a polarization film are included.

In other words, after forming all components needed for each display cell CE before a scribing operation, the mother protective film 50 is integrally attached to the mother display panel 100.

Although FIG. 3 illustrates the mother protective film 50 attached directly on the mother protective film 50 in the non-display area NDA, the disclosure is not limited thereto. Some insulating layers may be further arranged between the mother substrate 10 and the mother protective film 50.

The cutting lines CL1 and the first additional cutting lines CL2 may be formed in the above-described mother protective film 50 using a laser beam. For example, the laser beam may be a $CO_2$ laser or an yttrium aluminum garnet (YAG) laser. As in the present embodiment, when the mother protective film 50 includes a non-metallic organic compound material, a $CO_2$ laser may be used.

Here, by adjusting a laser beam intensity and/or a laser irradiation time, the mother protective film 50 is cut such that a beam does not reach the mother substrate 10 (this may be hereinafter referred to as half cutting).

In detail, a cutting depth D1 of the cutting lines CL1 and the first additional cutting lines CL2 is set to be less than a total thickness D2 of the mother protective film 50 such that the base film 52 of the mother protective film 50 is completely cut but the adhesive layer 51 cut only partially in a thickness direction.

When the base film 52 is not completely cut, it is difficult to peel the mother protective film 50, and thus, cutting is performed at least up to a thickness of the base film 52. However, as an intensity of an emitted laser beam has a process distribution in a certain range, if a laser beam intensity is too large, a cutting depth may exceed a depth of the adhesive layer 51 and may be greater than the thickness D2 of the mother protective film 50. In this case, the mother substrate 10 may be damaged, or when some insulating layers are on the mother substrate 10, the insulating layers may be damaged, and thus the organic light-emitting device 30 may be deteriorated. Thus, cutting may be performed by adjusting an intensity and/or an irradiation time of a laser beam such that the adhesive layer 51 is cut only partially in the depth direction.

According to another exemplary embodiment, in the mother protective film 50, the cutting lines CL1 and the first additional cutting lines CL2 may be formed using an ultrasound cutter. The ultrasound cutter resonates a vibrator and a blade by using a force generated in a piezoelectric element to generate a microvibration of about 20 kHz to about 40 kHz over a width of about 10 to about 70 micrometer (μm) in a third direction Z, thereby cutting the mother protective film 50. Also in this case, the mother protective film 50 is half cut such that the adhesive layer 51 is partially left so that ultrasound waves do not reach the mother substrate 10 by adjusting an amplitude and/or vibration of the ultrasound cutter.

Cutting performed using a laser beam requires a device that collects gas byproducts of the base film 52 and the adhesive layer 51 generated due to heat and discharges the gas byproducts, whereas no such byproducts are generated when an ultrasound cutter is used.

According to another exemplary embodiment, in the mother protective film 50, the cutting line CL1 and the first additional cutting line CL2 may be formed using a general cutter such as a knife. Also in this case, the mother protective film 50 may be half cut such that the adhesive layer 51 is partially left so that the blade of a knife does not reach the mother substrate 10 by adjusting a cutting depth of the knife.

Referring to FIGS. 2C and 2D, the mother protective film 50 undergoes a primary peeling operation and a secondary peeling operation.

A portion of the mother protective film 50 in which the cutting line CL1 is formed primarily peeled from the mother display panel 100 by applying the first force F1 to the first additional cutting line CL2, and the dummy area RA except for the target area TA defined by the cutting line CL1 is secondarily peeled off by applying the second force F2 to the mother protective film 50.

In FIG. 2C, first forces F1 directed in different directions are indicated by the same reference numeral. Forces being indicated by the same reference numeral is not limited to forces having the same magnitude, and may be interpreted as forces with similar magnitudes being applied.

Referring to FIG. 4 illustrating a portion B of FIG. 2C, the first force F1 is applied to the mother protective film 50 in the second direction Y by using a peeling pin 60. An irregularity or a jagged surface 61 is formed at an end of the peeling pin 60 to increase friction with the mother protective film 50.

When the first force F1 is applied in the second direction Y from a first additional cutting line CL2, a cutting line CL1 connected to the first additional cutting line CL2 and directed in the second direction Y is also cut, and thus the mother protective film 50 adjacent to the first additional cutting line CL2 is peeled off and pushed in the second direction Y.

On the other hand, when the first force F1 is applied in a direction −Y opposite to the second direction Y from an adjacent first additional cutting line CL2, a cutting line CL1 connected to the adjacent first additional cutting line CL2 and directed in the direction −Y opposite to the second direction Y is also cut, and thus the mother protective film 50 is peeled off and pushed in the direction −Y opposite to the second direction Y.

As shown in FIG. 2C, the first force F1 is applied from a plurality of places where the first additional cutting lines CL2 are formed. A portion of the mother protective film 50 is peeled by the first force F1. In other words, areas of the mother protective film 50 where the first additional cutting lines CL2 in the first direction X are formed and areas of the mother protective film 50 where the cutting lines CL1 in the second direction Y are formed, as portions of the mother protective film 50 indicated by bold segments in FIG. 2D, are peeled by the first force F1. At this time, because the cutting lines CL1 and the first additional cutting lines CL2 have been half-cut, tearing of the adhesive layer 51 may occur in a portion where the adhesive layer 51 has not been completely cut.

When a portion of the mother protective film 50 has been primarily peeled and the second force F2 is applied to the dummy area RA of the mother protective film 50 in the first direction X, portions of the mother protective film 50 not peeled during primary peeling at the cutting line CL1, namely, portions not indicated by the bold segments in FIG. 2D, are easily peeled off because each of the portions extends in the first direction X that is the same as a direction of the second force F2. Such secondary peeling may be conducted simultaneously at several portions during one process, or may be conducted during a plurality of numbers of processes.

Although the direction of the second force F2 is illustrated two-dimensionally on a XY plane, the second force F2 may be applied as a three-dimensional vector. For example, the second force F2 may have a component in a third direction Z. A component in the third direction Z included in of the second force F2 may be more adhesive than the mother protective film 50 and the mother substrate 10.

When the first force F1 is omitted and only the second force F2 is applied, the adhesive layer 51 is partially left without being removed from areas that are not parallel to the first direction X, which is a component on a plane of the second force F2, but cross the first direction X, namely, portions of each cutting line CL1 each extending in the second direction Y, and accordingly, the target areas TA near the cutting line CL1 may be lifted during a peeling operation. However, according to the present embodiment, before applying the second force F2, the first forces F1 are applied to portions of the cutting line CL1 each extending in a direction intersecting with the second force F2 on a plane, and accordingly the cutting line CL1 is peeled off in advance. Thus, according to the present embodiment, the dummy area RA may be peeled with less defect. At this time, because the adhesive layer 51 has not been completely removed due to half cutting, the adhesive layer 51 may be left with an irregular width and an irregular height at a portion of a virtual closed loop-shaped line that surrounds a display area.

Before the primary peeling of the mother protective film 50, a process of etching the mother substrate 10 formed of a glass material such that the mother substrate 10 becomes thinner may be further included. In this case, an acid-resistant film may be further attached onto the mother protective film 50. As the mother substrate 10 becomes thinner, a thin display apparatus may be obtained.

Referring to FIG. 2E, after the dummy area RA of the mother protective film 50 is peeled off and the target areas TA are left, the mother substrate 10 is scribed.

Scribing lines SL are formed along rims of the plurality of display cells CE in the first direction X and the second direction Y.

A scribing operation may be performed using a laser beam or a wheel cutting device. The laser beam may be a $CO_2$ laser or a YAG laser. Alternatively, scribing lines SL may be formed by applying a force from the mother protective film 50 towards the mother substrate 10 by using a wheel cutting device. In other words, the scribing operation may be simplified by performing the scribing operation on an upper surface of the mother substrate 10 without reversing the mother substrate 10.

Referring to FIG. 2F, an operation of rounding corner portions E1, E2, E3, and E4 of a display cell CE-0 that is separated as a result of the scribing operation is illustrated. By rounding the corner portions E1, E2, E3, and E4, apparatus strength may be reinforced.

Referring to FIG. 2G, an operation of polishing a rim of a display cell CE is illustrated. As the boundary of the display cell CE scribed using a wheel cutting device has a rough surface, a defect may be caused in a subsequent module process. Thus, by polishing the boundary of the display cell CE, a defect rate of the display cell CE may be reduced.

After the operation illustrated in FIG. 2G, a cleaning operation or the like may be additionally performed, and when a subsequent operation, such as combining an external connection terminal to a pad unit PAD while the target area TA is being attached to a protective film, is completed, the protective film attached to the target area TA may be finally removed. Alternatively, when the protective film attached to the target area TA may not be removed but left when the protective film is a functional film or according to other necessity.

As described above, in a method of peeling a mother protective film and a method of manufacturing an organic light-emitting display apparatus, according to the disclosure, peeling is conducted by applying the first forces F1 to portions of the cutting line CL1 each extending in a direction intersecting with the second force F2 on a plane before applying the second force F2, and thus, the dummy area RA may be peeled with less defects. In addition, a protective film is not attached to each of individual display cells, but a protective film is integrally used and attached, and thus, the process may be simplified. Moreover, even when a protective film is attached to a mother display panel of a combination of a glass substrate and a thin-film encapsulation member, a scribing operation may be performed just by using a wheel cutting device, and thus, the process may be simplified.

A method of manufacturing an organic light-emitting display apparatus, according to a comparative example, will be described with reference to FIGS. 5A, 5B, 5C, 5D, 5E, and 5G. The method of FIGS. 5A, 5B, 5C, 5D, 5E, and 5G will be described by focusing on differences from the method of manufacturing an organic light-emitting display apparatus according to the exemplary embodiment of FIGS. 2A, 2B, 2C, 2D, 2E, 2F, and 2G).

Figure 5A:
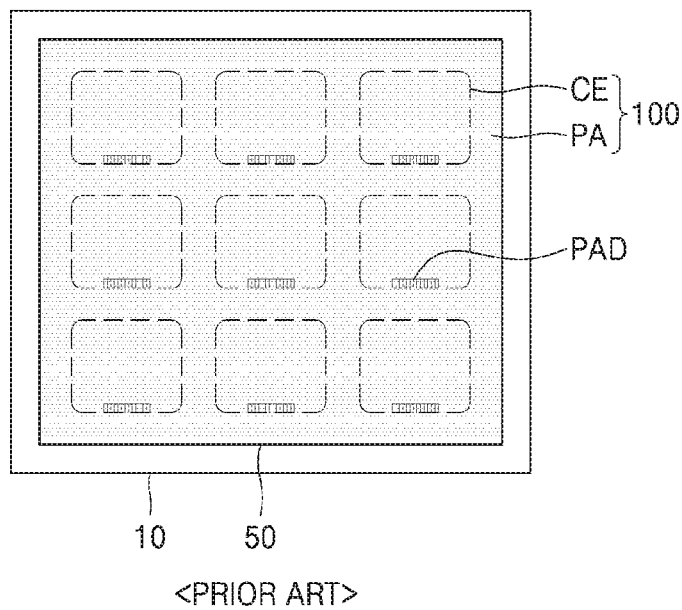
FIGS. 5A, 5B, 5C, 5D, 5E, 5F, and 5G are plan views schematically illustrating a method of manufacturing an organic light-emitting display apparatus, according to a comparative example.

Referring to FIG. 5A, the mother protective film 50 is laminated on the mother display panel 100.

The mother display panel 100 may include a plurality of display cells CE and a peripheral area PA located around the display cells CE, and the mother substrate 10 may include a glass material. The mother protective film 50 is attached onto the display cells CE to protect the display cells CE.

Figure 5B:
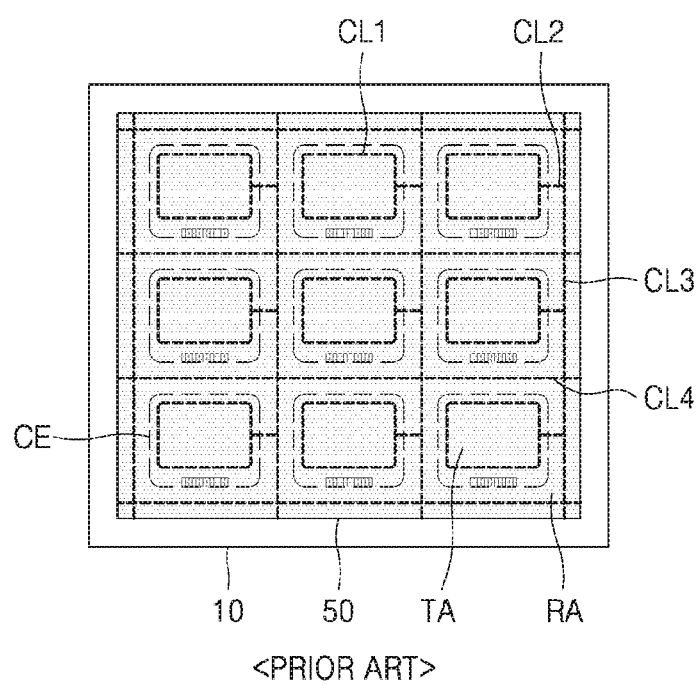

Referring to FIG. 5B, cutting lines CL1, first additional cutting lines CL2, second additional cutting lines CL3, and third additional cutting line CL4 are formed on the mother protective film 50.

Similar to the above-described embodiment of FIG. 1, each cutting line CL1 has a closed loop shape that is smaller than an area of each display cell CE in an area corresponding to each display cell CE.

Each first additional cutting line CL2 extends in the second direction Y, but is not connected between adjacent cutting lines CL1, and an end of the first additional cutting line CL2 is connected to a second additional cutting line CL3. The second additional cutting lines CL3 and the third additional cutting lines CL4 surround the display cells CE and are each cut in a lattice shape.

The cutting lines CL1 and the first through third additional cutting lines CL2, CL3, and CL4 may be formed using a $CO_2$ laser beam. Here, by adjusting a laser beam intensity and/or a laser irradiation time, the mother protective film 50 is cut such that a beam does not reach the mother substrate 10.

Figure 5C:
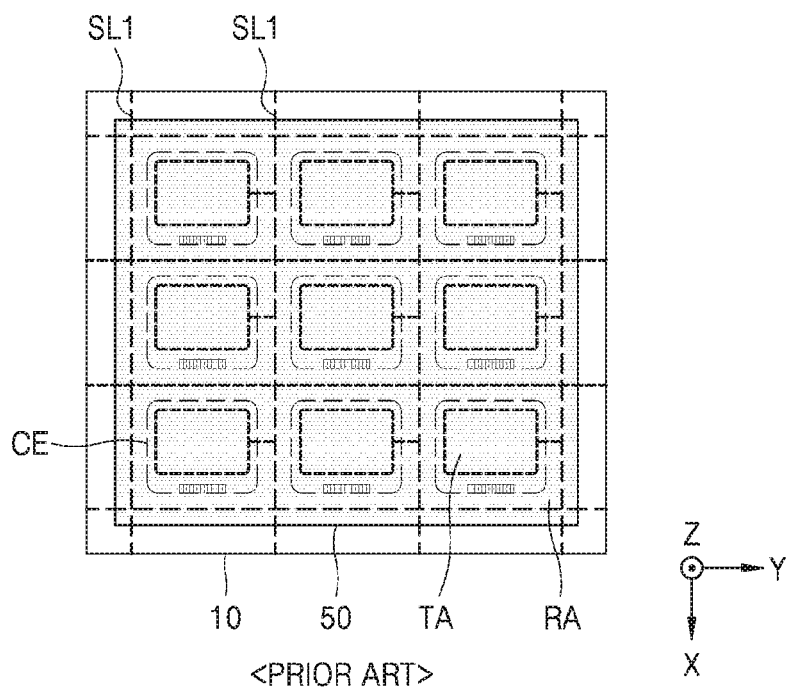

Referring to FIG. 5C, when the mother protective film 50 has been entirely attached, a first scribing operation is performed on the mother substrate 10.

Before the first scribing operation, a process of etching the mother substrate 10 formed of a glass material such that the mother substrate 10 becomes thinner may be further included. In this case, an acid-resistant film may be further attached onto the mother protective film 50.

A plurality of first scribing lines SL1 are formed along rims of the plurality of display cells CE in the first direction X and the second direction Y. In the first scribing operation, a laser beam may be used. Alternatively, in the first scribing operation, a wheel cutting device may be used.

In the comparative example, the mother protective film 50 of the dummy area RA not removed, and thus, no force may be applied from the mother protective film 50 toward the mother substrate 10. In other words, after having reversed the mother substrate 10, the first scribing operation is performed on a lower surface of the mother substrate 10. Unlike the above-described embodiment of FIGS. 2A, 2B, 2C, 2D, 2E, 2F, and 2G, an operation of turning the mother substrate 10 upside down is additionally performed.

After the first scribing operation, the mother display panel 100 is divided into a plurality of units each including a display cell CE-1.

Figure 5D:
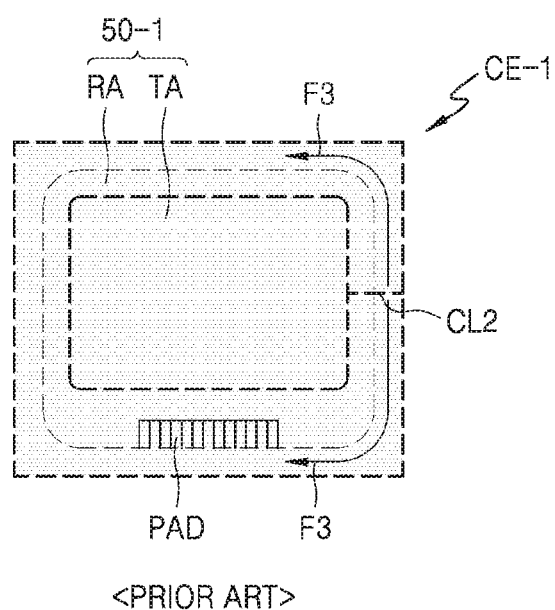

Referring to FIG. 5D, an operation of peeling a dummy area RA of a mother protective film 50-1 obtained due to the aforementioned division from the display cell CE-1 obtained as a result of the first scribing operation is illustrated.

The dummy area RA of the mother protective film 50-1 is peeled by applying a force F3 in two directions from each first additional cutting line CL2. It is necessary to perform the peeling operation with respect to a plurality of display cells CE-1 obtained by the aforementioned division, and accordingly the peeling operation is repeated a number of times that is equal to the number of display cells CE-1. In addition, by turning the display cell CE-1 upside down again, a peeling operation is performed on an upper surface of the mother protective film 50-1.

Figure 5E:
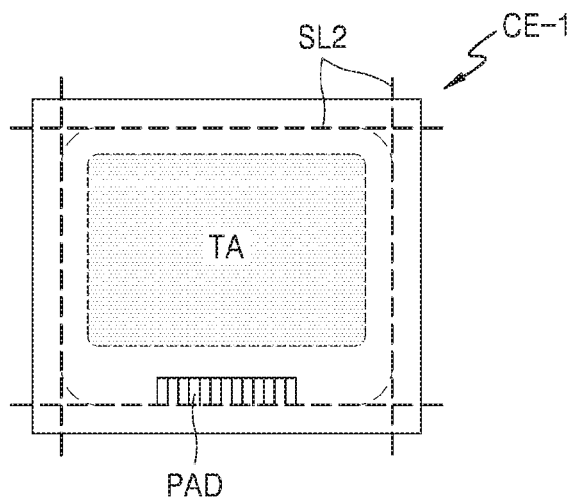

Referring to FIG. 5E, when the dummy area RA has been peeled off and the target area TA remains, a second scribing operation in which second scribing lines SL2 are formed to remove a boundary of the display cell CE-1 is performed.

Figure 5F:
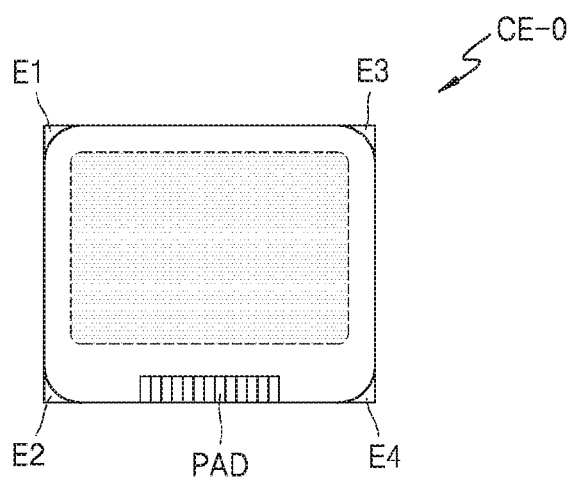

Referring to FIG. 5F, corner portions E1, E2, E3, and E4 of a display cell CE-0 obtained as a result of the second scribing operation are rounded, thereby forming a display cell CE-0 having rounded corner portions.

Figure 5G:
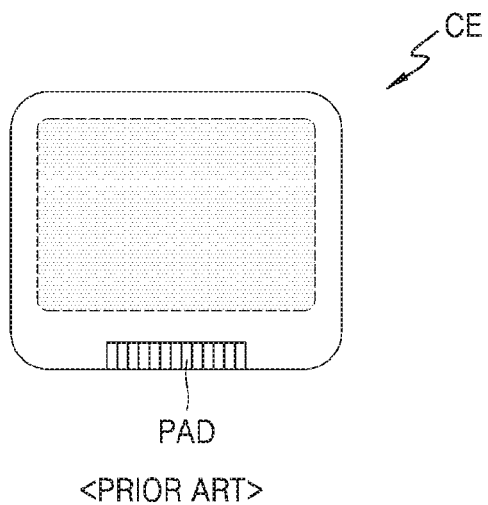

Referring to FIG. 5G, a display cell CE is formed by polishing a boundary of the display cell CE-0 of FIG. 5F.

Unlike the comparative example, in the present embodiment, instead of removing a dummy area of a protective film for each individual display cell, a dummy area may be removed at a time in a mother state, thus increasing process efficiency. In addition, the number of times a mother substrate is turned upside down may be reduced, and thus the process efficiency may be increased.

Hereinafter, various examples of a cutting line and an additional cutting line formed in the mother protective film 50 according to the present embodiment will be described with reference to FIGS. 6, 7, 8, 9, and 10.

Figure 6:
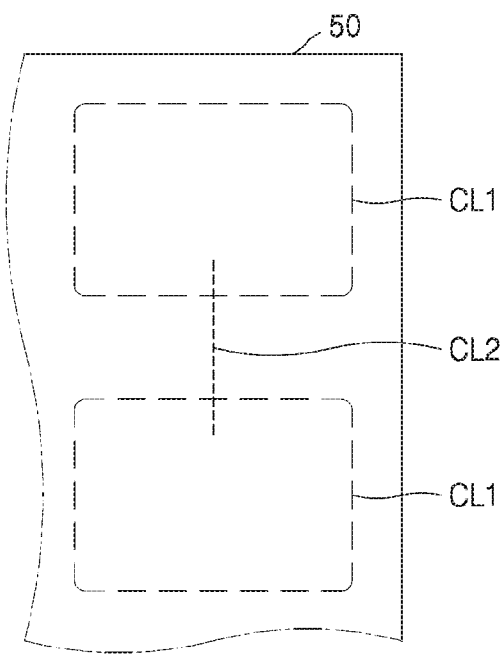
FIGS. 6, 7, 8, 9, and 10 are plan views illustrating various examples of a cutting line and an additional cutting line.

Referring to FIG. 6, both ends of a first additional cutting line CL2 connected between cutting lines CL1 are formed inside the cutting lines CL1. In other words, by overlapping the cutting lines CL1 and the first additional cutting line CL2, the peeling operation may be easily performed.

Figure 7:
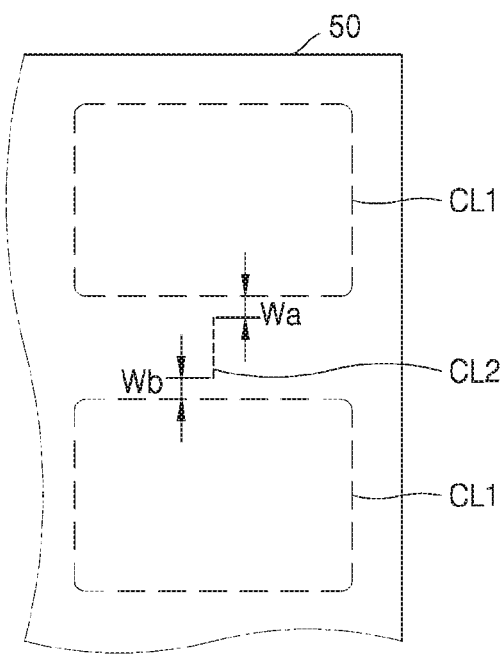

Referring to FIG. 7, the first additional cutting line CL2 may be spaced apart from the cutting lines CL1. A first end of the first additional cutting line CL2 may be spaced apart from a cutting line CL1 by a first width $w_a$, and a second end of the first additional cutting line CL2 may be spaced apart from another cutting line CL1 by a second width $w_b$. Along the first width $w_a$ and the second width $w_b$, a portion of the adhesive layer 51 (see FIG. 3) may remain.

Figure 8:
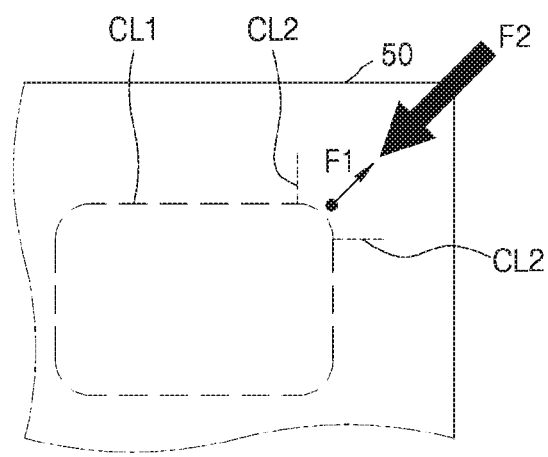

Referring to FIG. 8, two first additional cutting lines CL2 may be formed at a corner portion of a cutting line CL1. In this case, a first peeling process may be conducted by applying a first force F1 in a direction opposite to a direction of a second force F2 from the corner portion of the cutting line CL1. Even in this case, because peeling is conducted by applying the first force F1 to portions of the cutting line CL1 each extending in a direction intersecting with the second force F2 on a plane before applying the second force F2, the dummy area RA may be peeled with less defects.

Figure 9:
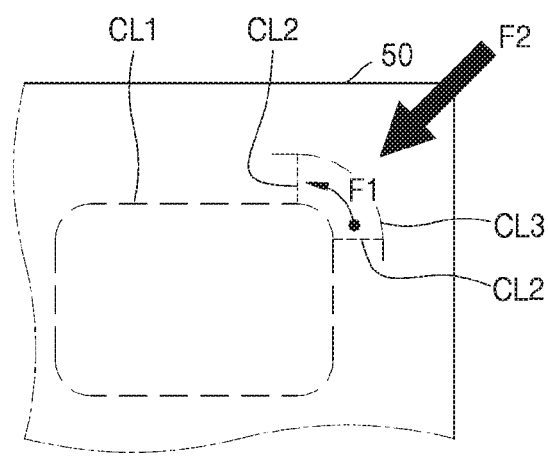

Referring to FIG. 9, two first additional cutting lines CL2 may be formed at a corner portion of a cutting line CL1, and two second additional cutting lines CL3 may be formed around the corner portion of the cutting line CL1 to be parallel to the corner portion of the cutting line CL1. The two second additional cutting lines CL3 are connected to both ends of the two first additional cutting lines CL2, respectively. In this case, a first peeling process may be conducted by applying a first force F1 from one of the two first additional cutting lines CL2 in a direction intersecting with a direction of a second force F2. Even in this case, because peeling is conducted by applying the first force F1 to portions of the cutting line CL1 each extending in a direction intersecting with the second force F2 on a plane before applying the second force F2, the dummy area RA may be peeled with less defects.

Figure 10:
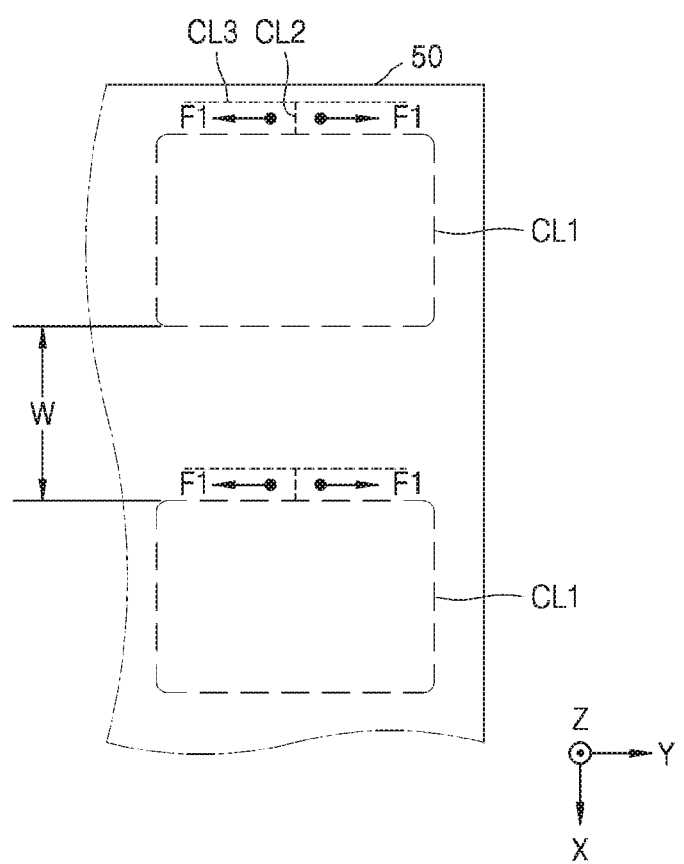

Referring to FIG. 10, when an interval w between adjacent cutting lines CL is wide, peeling by using only first additional cutting lines CL2 may be difficult. Second additional cutting lines CL3 parallel to cutting lines CL1 and connected to the first additional cutting lines CL2 are formed, and first forces F1 are applied from the first additional cutting lines CL2 in the second direction Y. Even in this case, because peeling is conducted by applying the first force F1 to portions of the cutting line CL1 each extending in a direction intersecting with the second force F2 (see FIG. 7) on a plane before applying the second force F2, the dummy area RA may be peeled with less defects.

A method of manufacturing an organic light-emitting display apparatus, according to another exemplary embodiment, will now be described with reference to FIGS. 11A, 11B, 11C, and 11D. The present embodiment will be described by focusing on differences from the exemplary embodiment of FIG. 1.

Figure 11A:
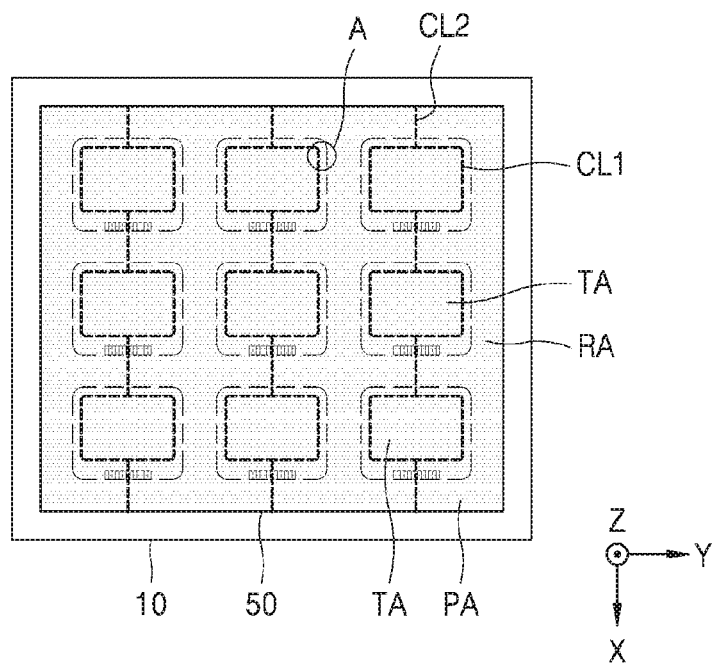
FIGS. 11A, 11B, 11C, and 11D are plan views schematically illustrating a method of manufacturing an organic light-emitting display apparatus, according to another exemplary embodiment.

FIG. 11A illustrates a state identical to that of FIG. 2B of the exemplary embodiment of FIG. 1. In other words, after laminating the mother display panel 100 (see FIG. 2B) and the mother protective film 50, cutting lines CL1 and first additional cutting lines CL2 are formed in the mother protective film 50. In this case, the adhesive layer 51 (see FIG. 3) of the mother protective film 50 has relatively high adhesive force.

Figure 11B:
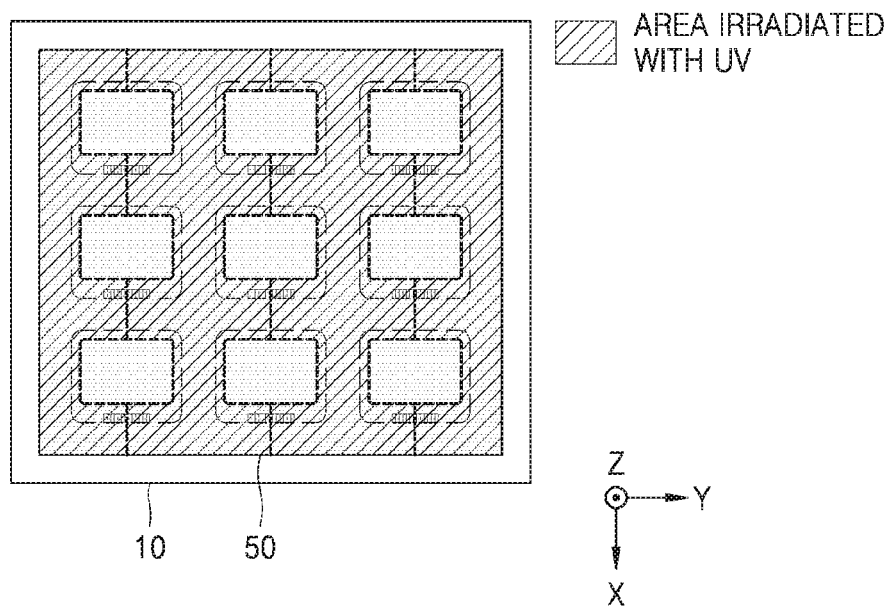

Referring to FIG. 11B, an area except for the target area TA of the mother protective film 50, that is, the dummy area RA, are irradiated with ultraviolet (UV) ray to reduce the adhesiveness of the adhesive layer.

Figure 11C:
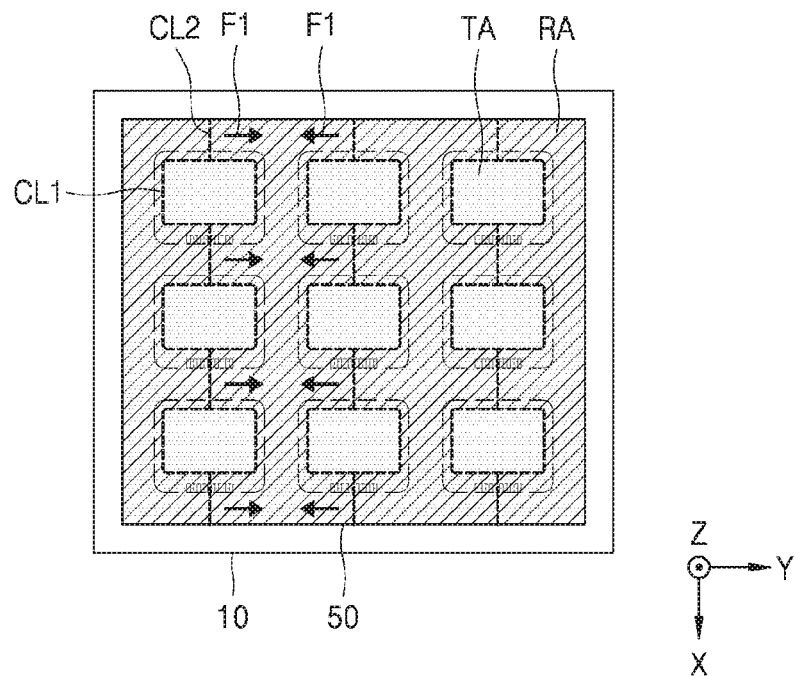
Figure 11D:
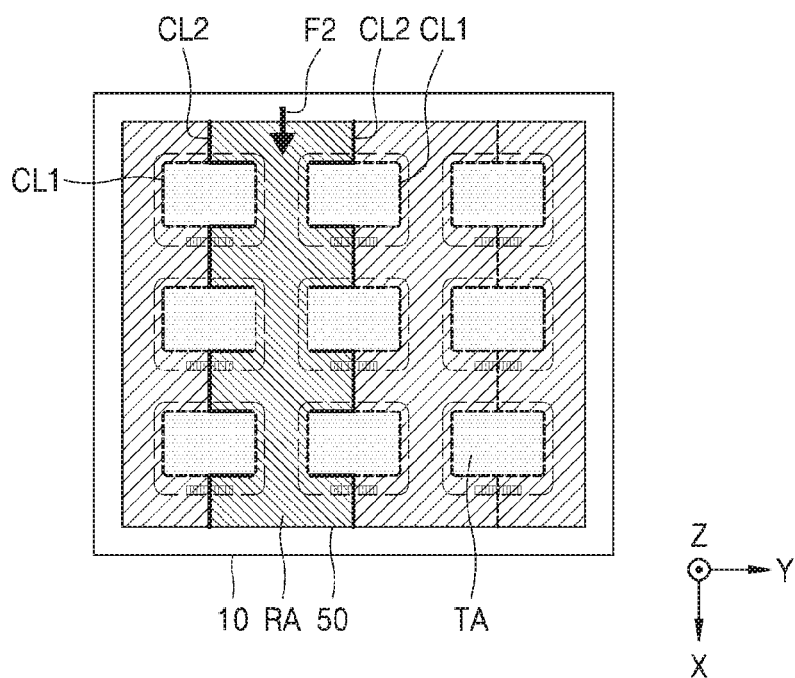

Referring to FIGS. 11C and 11D, a portion of the mother protective film 50 in which the cutting lines CL1 are formed is primarily peeled from the mother display panel 100 by applying the first force F1 to the first additional cutting lines CL2, and the dummy area RA except for the target areas TA defined by the cutting lines CL1 is secondarily peeled off by applying the second force F2 to the mother protective film 50. The exemplary embodiment of FIGS. 11C and 11D is different from FIGS. 2C and 2D in that UV is further irradiated to the dummy area RA of the mother protective film 50.

By using the mother protective film 50 but irradiating only the dummy area RA with UV, adhesiveness of the dummy area RA may be reduced, thereby facilitating the peeling operation. In addition, in the target areas TA, adhesiveness of the mother protective film 50 is strong, and thus, the present embodiment may be applied to an operation that requires strong adhesiveness, for example, to a case where the mother protective film 50 is attached onto a polarization film and used.

A method of manufacturing an organic light-emitting display apparatus, according to another exemplary embodiment, will now be described with reference to FIGS. 12A, 12B, 12C, and 12D. The present embodiment will be described by focusing on differences from the exemplary embodiment of FIGS. 11A, 11B, 11C, and 11D.

Figure 12A:
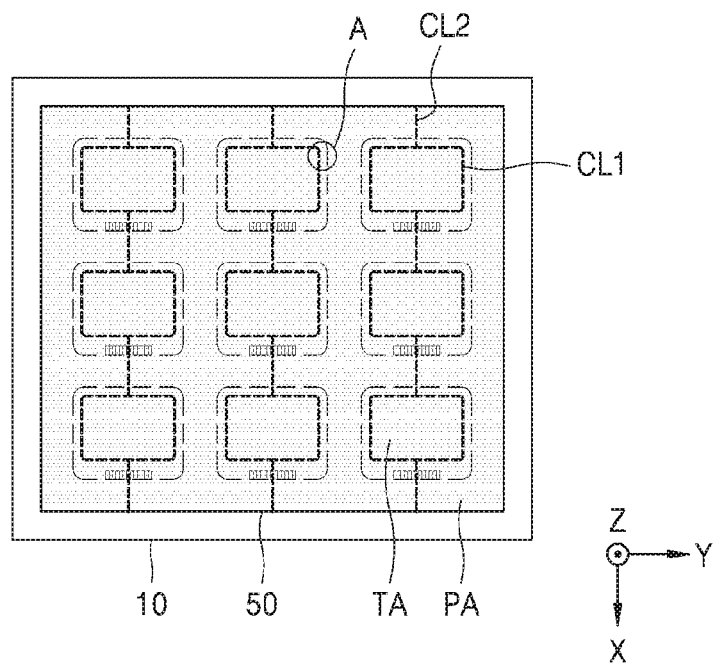
FIGS. 12A, 12B, 12C, and 12D are plan views schematically illustrating a method of manufacturing an organic light-emitting display apparatus, according to another exemplary embodiment.
Figure 12B:
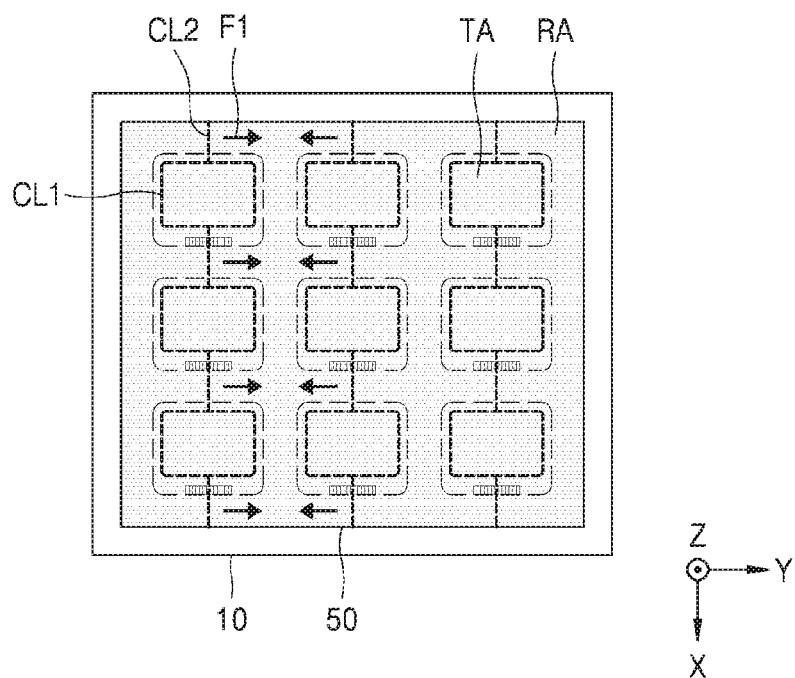

FIG. 12A is identical to FIG. 11A except for adhesiveness of the mother protective film 50. In other words, after laminating the mother display panel 100 (see FIG. 2B) and the mother protective film 50, cutting lines CL1 and first additional cutting lines CL2 are formed in the mother protective film 50. In this case, the adhesive layer 51 (see FIG. 3) which is lowly adhesive is used as the mother protective film 50.

Figure 12C:
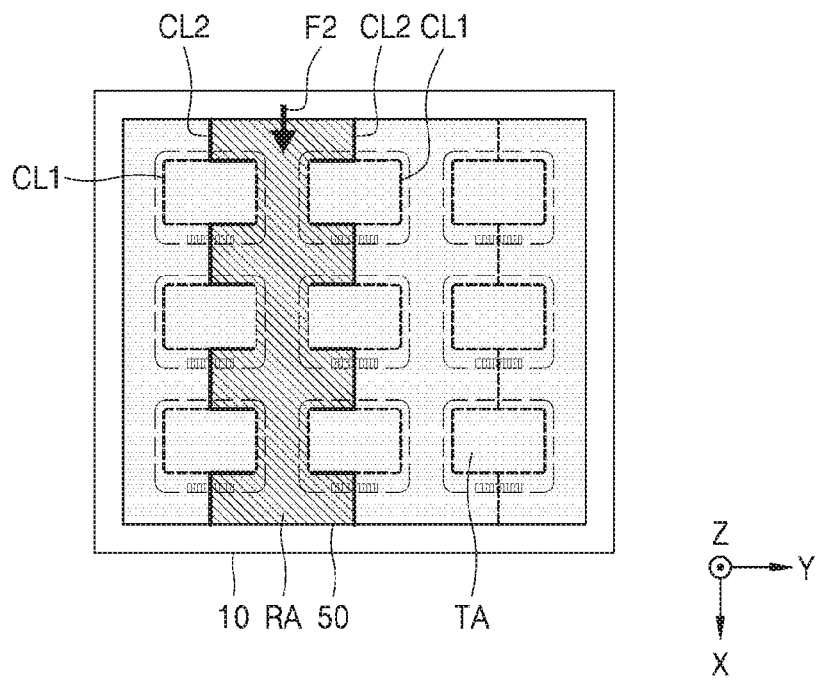
Figure 12D:
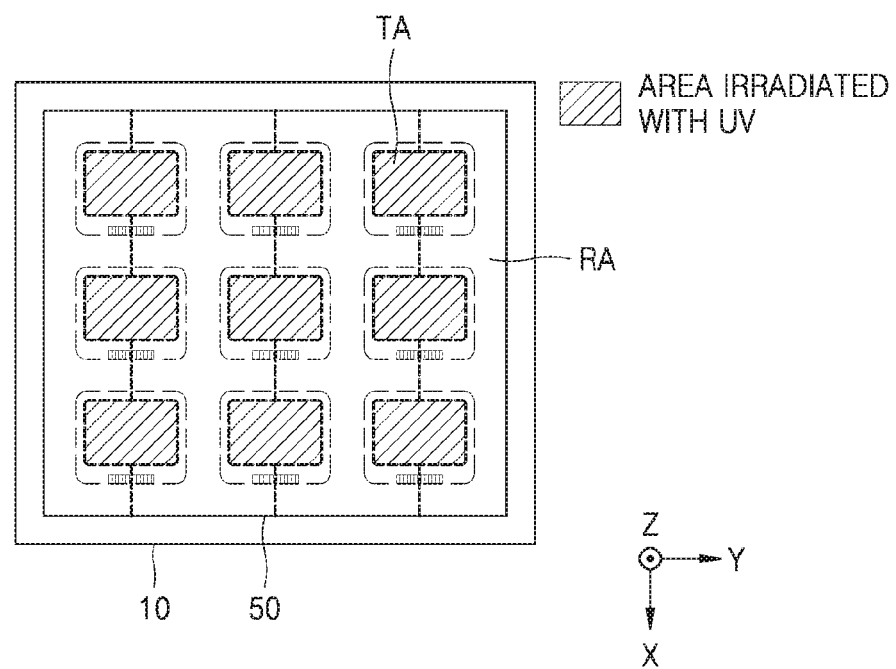

Referring to FIGS. 12C and 12D, a portion of the mother protective film 50 in which the cutting lines CL1 are formed is primarily peeled from the mother display panel 100 by applying the first force F1 to the first additional cutting lines CL2, and the dummy area RA except for the target areas TA defined by the cutting lines CL1 is secondarily peeled off by applying the second force F2 to the mother protective film 50.

Referring to FIG. 12D, only the target areas TA of the mother protective film 50 are irradiated with UV by using a mask, thereby reinforcing the adhesiveness of the adhesive layer 51.

Compared to the exemplary embodiment of FIGS. 11A, 11B, 11C, and 11D, the present embodiment is different in that, even though an adhesive layer having low adhesiveness used, UV is radiated to target areas after a peeling operation to thereby reinforcing the adhesiveness of the adhesive layer. However, also in the present embodiment, adhesiveness of the mother protective film 50 is strong in the target areas TA, and thus, the present embodiment may be applied to an operation that requires strong adhesiveness, for example, to a case where the mother protective film 50 is attached onto a polarization film and used.

A method of manufacturing an organic light-emitting display apparatus, according to another exemplary embodiment, will now be described with reference to FIGS. 13 and 14.

Figure 13:
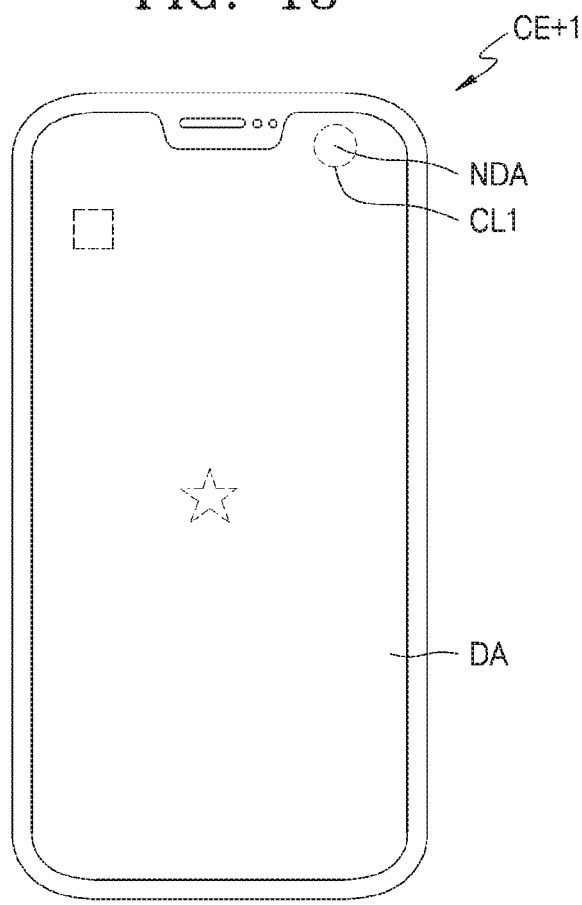
FIGS. 13 and 14 are views for schematically illustrating a method of manufacturing an organic light-emitting display apparatus, according to another exemplary embodiment.
Figure 14:
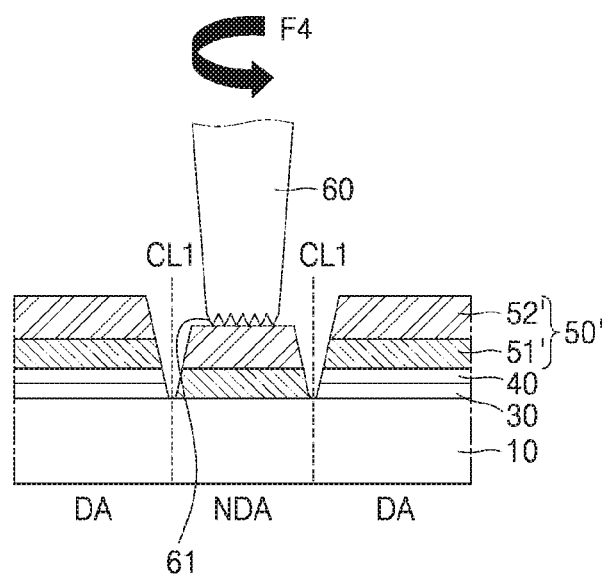

Referring to FIGS. 13 and 14, a display cell CE+1 includes a display area DA, and a non-display area NDA including a circular or irregular hole formed within the display area DA.

A stacking structure of the display area DA is the same as that according to the aforementioned embodiment of FIG. 1. Accordingly, a plurality of organic light-emitting devices 30 (see FIG. 3) are arranged on a substrate 10, and the thin-film encapsulation member 40 (see FIG. 3) encapsulates the organic light-emitting devices 30. The present embodiment is different from the aforementioned embodiment of FIG. 1 in that the non-display area NDA is located within the display area DA.

In this case, a protective film 50' may be arranged on the thin-film encapsulation member 40 in the display area DA and on the substrate 10' in the non-display area NDA. As described above, in the display area DA, a touch sensing layer and/or a polarization film may be further arranged between the thin-film encapsulation member 40 and the protective film 50'.

The protective film 50' includes an adhesive layer 51' and a base film 52', and a closed loop-shaped cutting line CL1 is formed around a hole corresponding to the non-display area NDA in the protective film 50'. A depth of the cutting line CL1 may be less than or equal to a thickness of the protective film 50'.

A subsequent process may be conducted on holes obtained by peeling protective film 50' from the substrate 10' by applying a twisting force F4 to the closed loop-shaped cutting line CL1. According to the aforementioned present embodiment, even when a dummy area of the protective film 50' is very narrow, the protective film 50' may be peeled from the substrate 10' by using the aforementioned cutting process and a twisting force.

According to the aforementioned present embodiment, because peeling is conducted by applying the first force F1 to portions of a cutting line CL1 each extending in a direction intersecting with the second force F2 on a plane before applying the second force F2, the dummy area RA may be peeled with less defects.

In addition, a protective film is not attached to each of individual display cells CE, but a protective film is used and attached integrally, and thus, the process may be simplified.

Moreover, even when a protective film is attached to a mother display panel of a combination of a glass substrate and a thin-film encapsulation member, a scribing operation may be performed just by using a wheel cutting device, and thus, the process may be simplified.

In addition, the scribing operation may be simplified by performing the scribing operation on an upper surface of the mother substrate 10 without reversing the mother substrate 10.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of peeling a mother protective film from a mother display panel, the method comprising:

laminating the mother display panel and the mother protective film, the mother display panel comprising a plurality of display cells each comprising a display area and a peripheral area around the plurality of display cell;

forming a target area and a dummy area in the mother protective film by forming a cutting line in a closed loop shape enclosing the target area corresponding to each of the display cells and a first additional cutting line in a first direction near the cutting line, the first additional cutting line connected to the cutting line;

physically peeling off the dummy area from the mother display panel, comprising:
primarily peeling off a portion of the mother protective film adjacent to the first additional cutting line; and
secondarily peeling off rest of the mother protective film from the mother display panel along the cutting line.

2. The method of claim 1, wherein depths of the cutting line and the first additional cutting line are less than a thickness of the mother protective film.

3. The method of claim 1, wherein the cutting line and the first additional cutting line are formed using a laser beam.

4. The method of claim 3, wherein the laser beam comprises a $CO_2$ laser.

5. The method of claim 1, wherein the cutting line and the first additional cutting line are formed using a knife.

6. The method of claim 1, wherein the cutting line and the first additional cutting line are formed using an ultrasound cutter including a vibrator and a blade.

7. The method of claim 1, wherein at least an end of the first additional cutting line is formed within the cutting line.

8. A method of peeling a mother protective film from a mother display panel, the method comprising:
laminating the mother display panel and the mother protective film, the mother display panel comprising a plurality of display cells each comprising a display area and a peripheral area around the plurality of display cell;

forming a target area and a dummy area in the mother protective film by forming a cutting line in a closed loop shape enclosing the target area corresponding to each of the display cells and a first additional cutting line in a first direction near the cutting line;

physical peeling off the dummy area from the mother display panel, comprising:
primarily peeling off a portion of the mother protective film adjacent to the first additional cutting line; and
secondary peeling off rest of the mother protective film from the mother display panel along the cutting line, wherein
the primarily peeling off of the portion of the mother protective film comprises applying a first force having a component in a second direction away from the first additional cutting line, the second direction intersecting with the first direction, and
the secondarily peeling off of the rest of the mother protective film comprises applying a second force in the first direction to the primarily peeled mother protective film.

9. The method of claim 8, wherein the first additional cutting line is spaced apart from the cutting line.

10. The method of claim 8, further comprising:
forming, in the mother protective film, a second additional cutting line connected to the first additional cutting line.

11. The method of claim 10, wherein the primarily peeling off of the portion of the mother protective film comprises applying a first force between the first additional cutting line and the second additional cutting line.

12. The method of claim 8, wherein the primarily peeled mother protective film comprises a portion of the cutting line extending in a direction intersecting with the second force.

13. The method of claim 8, wherein the first force is applied using a peeling pin.

14. The method of claim 1, wherein the target area defined by the cutting line in a closed loop shape has a smaller area than the display cell.

15. The method of claim 1, wherein the mother protective film comprises an adhesive layer attached to the mother display panel and a base substrate arranged on the adhesive layer.

16. The method of claim 15, the method further comprising, before the primarily peeling, irradiating the dummy area with ultraviolet rays (UV) to reduce an adhesive force of a portion of the adhesive layer corresponding to the dummy area.

17. The method of claim 15, the method further comprising, after the secondarily peeling, irradiating the target area with ultraviolet rays (UV) to increase an adhesive force of a portion of the adhesive layer corresponding to the target area.

18. The method of claim 1, wherein the mother display panel comprises a substrate comprising a glass material, and
wherein the method further comprises, before the primarily peeling off of the mother display panel, etching the substrate to reduce a thickness of the substrate.

* * * * *